(12) United States Patent
Hsu et al.

(10) Patent No.: US 8,810,262 B2
(45) Date of Patent: Aug. 19, 2014

(54) INTEGRATED LOW-NOISE SENSING CIRCUIT WITH EFFICIENT BIAS STABILIZATION

(71) Applicant: National Tsing Hua University, Hsinchu (TW)

(72) Inventors: Yung-Jane Hsu, Hsinchu (TW); Siew-Seong Tan, Hsinchu (TW)

(73) Assignee: National Tsing Hua University, Hsinchu (TW)

( * ) Notice: Subject to any disclaimer, the term of this patent is extended or adjusted under 35 U.S.C. 154(b) by 157 days.

(21) Appl. No.: 13/675,618

(22) Filed: Nov. 13, 2012

(65) Prior Publication Data
US 2014/0132284 A1    May 15, 2014

(51) Int. Cl.
| | |
|---|---|
| *G01R 27/26* | (2006.01) |
| *G01R 31/08* | (2006.01) |
| *G01L 1/00* | (2006.01) |
| *G01R 31/312* | (2006.01) |
| *G01L 1/14* | (2006.01) |

(52) U.S. Cl.
CPC .......... *G01R 27/2605* (2013.01); *G01R 31/312* (2013.01); *G01L 1/142* (2013.01)
USPC .............. 324/686; 324/658; 324/519; 73/780

(58) Field of Classification Search
CPC .. G01R 27/26; G01R 26/2605; G01R 31/016; G01R 31/312; G01F 23/26; G01F 23/263; G01L 1/14; G01L 1/142; G01L 5/165; G01L 9/0005; G01L 9/003; G01L 9/0038; G01L 9/0072; G01L 9/0086; G01L 9/0095; G01L 9/12; G01N 27/22; G01N 27/227; G01N 27/228; G01N 27/60; G01N 2014/0853; G01N 2027/22; G08B 13/26; H03K 17/995

USPC ........... 324/686, 658, 649, 600, 519; 702/47, 702/52; 73/718, 724, 780, 304 C, 335.04, 73/862.337, 862.626; 340/545.4, 562; 361/181

See application file for complete search history.

(56) References Cited

U.S. PATENT DOCUMENTS

| | | | | |
|---|---|---|---|---|
| 4,052,611 | A  * | 10/1977 | Fish | 398/145 |
| 6,366,099 | B1 * | 4/2002 | Reddi | 324/678 |

(Continued)

OTHER PUBLICATIONS

Lou et al., "A Post-CMOS Micromachined Lateral Accelerometer", Journal of Microelectromechanical Systems, vol. 11, No. 3, pp. 188-195, Jun. 2002.
Connor et al., "CMOS Preamplifier with High Linearity and Ultra Low Noise for X-Ray Spectroscopy", IEEE Transactions on Nuclear Science, vol. 44, No. 3, pp. 318-325, Jun. 1997.

(Continued)

*Primary Examiner* — Hoai-An D Nguyen
(74) *Attorney, Agent, or Firm* — Rabin & Berdo, P.C.

(57) ABSTRACT

An integrated low-noise sensing circuit with efficient bias stabilization in accordance with the present invention comprises a first capacitance sensing element, a second capacitance sensing element, a sub-threshold transistor and an amplifier circuit wherein the first stage is an input transistor. The second capacitance sensing element is connected to the first capacitance sensing element. The sub-threshold transistor comprises a body, a gate, a source, a drain, a source-body junction diode and a bulk. The gate forms on top of the body. The source forms on the body and is connected to the first capacitance sensing element and the second capacitance sensing element. The drain forms on the body and is connected to the gate and the amplifier output terminal. The source-body junction diode comprises an anode and a cathode. The anode is connected to the ground.

5 Claims, 3 Drawing Sheets

(56) References Cited

U.S. PATENT DOCUMENTS

| | | | |
|---|---|---|---|
| 2001/0008478 A1* | 7/2001 | McIntosh et al. | 361/115 |
| 2001/0020850 A1* | 9/2001 | McIntosh et al. | 324/519 |
| 2010/0201382 A1* | 8/2010 | Welland | 324/686 |
| 2011/0221519 A1* | 9/2011 | Katoh et al. | 327/558 |
| 2014/0049269 A1* | 2/2014 | Sosin et al. | 324/658 |

OTHER PUBLICATIONS

Tsai et al., "Mechanical Noise-Limited CMOS-MEMS Accelerometers", Micro Electro Mechanical Systems, 2005. MEMS 2005. 18th IEEE International Conference on, pp. 630-633, 2005.

* cited by examiner

INTEGRATED LOW-NOISE SENSING CIRCUIT WITH EFFICIENT BIAS STABILIZATION

FIELD OF THE INVENTION

The invention relates to an integrated low-noise sensing circuit, and more particularly, to an integrated low-noise sensing circuit with efficient bias stabilization.

BACKGROUND OF THE INVENTION

At the input node between the CMOS MEMS capacitive sensor structure and the on-chip continuous-time sensing circuit, proper DC bias voltage must be set up and maintained. MOSFET's operated in sub-threshold region have been used to provide the high impedance input bias in the sensing circuits for small capacitive sensors. Sub-threshold transistors can provide simple biasing paths with high impedance while introducing small amount of parasitic capacitance. In the design in L. H. Zhang, G. G. K. Fedder, and L. R. Carley, "A post-CMOS micro-machined lateral accelerometer", a sub-threshold NMOSFET was used to connect between the input node and the drain terminal of the input NMOSFET of the front-end amplifier in the sensing circuit. Unfortunately, bias instability could exist at the input node. Charging effect due to possible parasitic leakage paths from the input node to positive power supply rail (VDD) could induce a drift of the input node voltage toward VDD and eventually disable the system function. In J. M. Tsai and G. K. Fedder, "Mechanical noise-limited CMOS-MEMS accelerometers", the design of biasing was improved by using an additional sub-threshold transistor in anti-parallel with the original one and the latch-up phenomenon of input node voltage could be suppressed. Although this arrangement prevents the latch-up problem and retains the simplicity of the original design, the additional transistor introduces more capacitance that degrades signal strength. Furthermore, for both the single-transistor and dual-transistor designs, the mismatch of the sub-threshold transistors imposes significant impact on the output offset voltage of the front-end amplifier. Bias instability has been a critical issue since long time ago.

In P. O'Connor, G. Gramegna, P. Rehak, F. Corsi, and C. Marzocca, "CMOS preamplifier with high linearity and ultra low noise for X-ray spectroscopy", where the parallel copies of sub-threshold MOSFETs were used for DC biasing the input node of a charge sensitive amplifier, in order to maintain a more constant $R_{DS}$ of the sub-threshold MOSFETs against process, voltage, and temperature variations, an additional complicated self-adaptive circuitry was implemented. The self-adaptive circuitry consumes large chip area and increases power consumption. Furthermore, a current mirror with large scaling ratio was needed in the circuitry, which introduces an additional variation issue. From today's view point, especially for mass production, a reliable and efficient biasing scheme is still in need for practical applications.

SUMMARY OF THE INVENTION

One object of the invention is to offer an integrated low-noise sensing circuit with effective biasing scheme that provides a stable input bias voltage and a stable feedback resistance, does not degrade the signal strength, is resistant to the die-to-die variation of the sub-threshold transistor, and does not need any extra power and chip area.

An integrated low-noise sensing circuit with efficient bias stabilization in accordance with the present invention comprises a first capacitance sensing element, a second capacitance sensing element, a sub-threshold transistor and an amplifier circuit wherein the first stage is an input transistor.

The second capacitance sensing element is connected to the first capacitance sensing element.

The sub-threshold transistor comprises a body, a gate, a source, a drain, a source-body junction diode and a bulk. The gate forms on top of the body. The source forms on the body and is connected to the first capacitance sensing element and the second capacitance sensing element. The drain forms on the body and is connected to the gate of the sub-threshold transistor. The source-body junction diode comprises an anode and a cathode. The anode is connected to the ground. The cathode is connected to the first capacitance sensing element, the second capacitance sensing element and the source of the sub-threshold transistor.

The amplifier circuit comprises a gate, a source and a drain. The gate is connected to the first capacitance sensing element, the second capacitance sensing element, the source of the sub-threshold transistor and the cathode of the source-body junction diode.

The drain and the gate of the sub-threshold transistor are connected to the amplifier output terminal. When the input transistor itself forms the amplifier, its drain is the amplifier output terminal and is connected to the drain and the gate of the sub-threshold transistor.

DETAILED DESCRIPTION OF THE INVENTION

Figure 1:
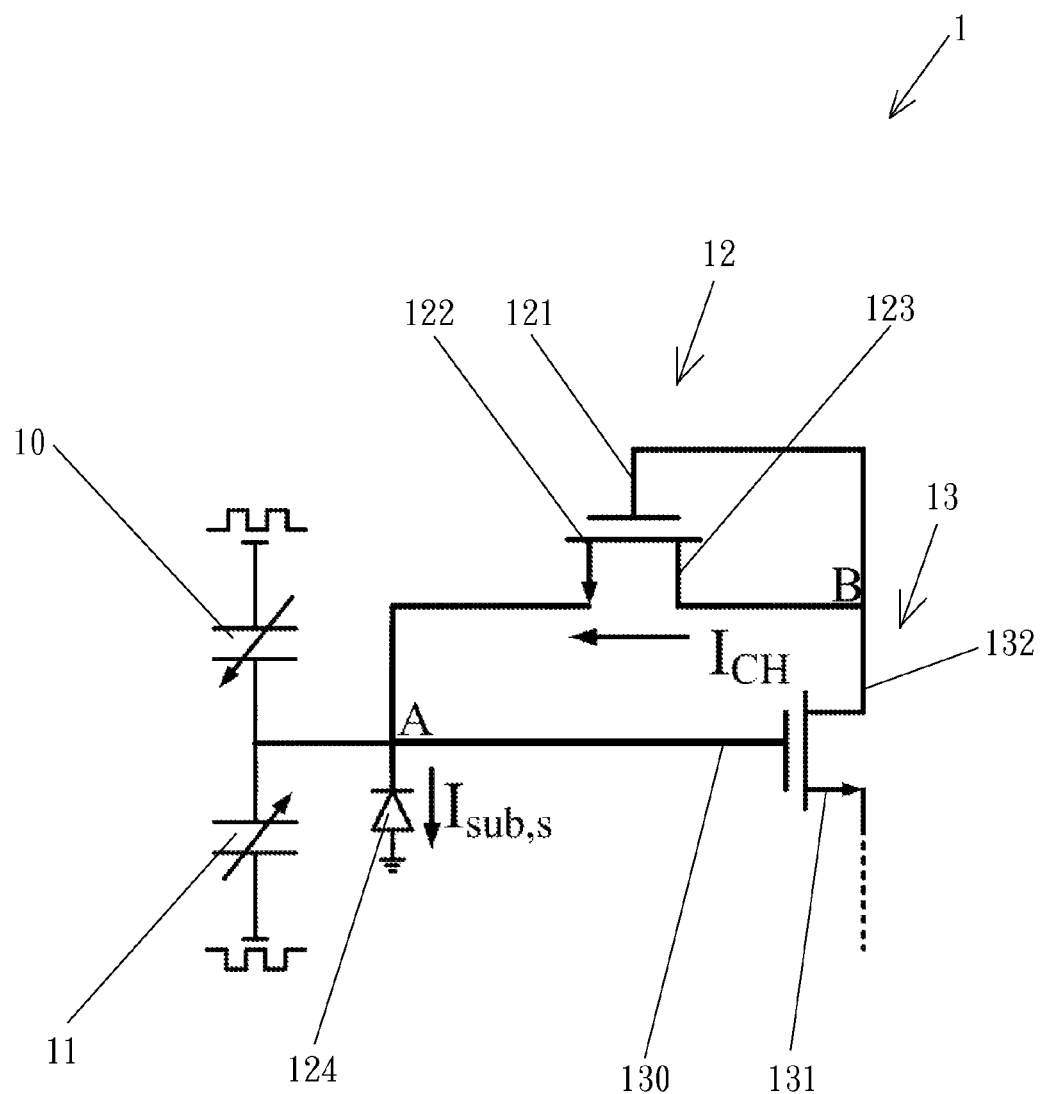
FIG. 1 is a circuit diagram in the integrated low-noise sensing circuit with efficient bias stabilization of this invention.
Figure 2:
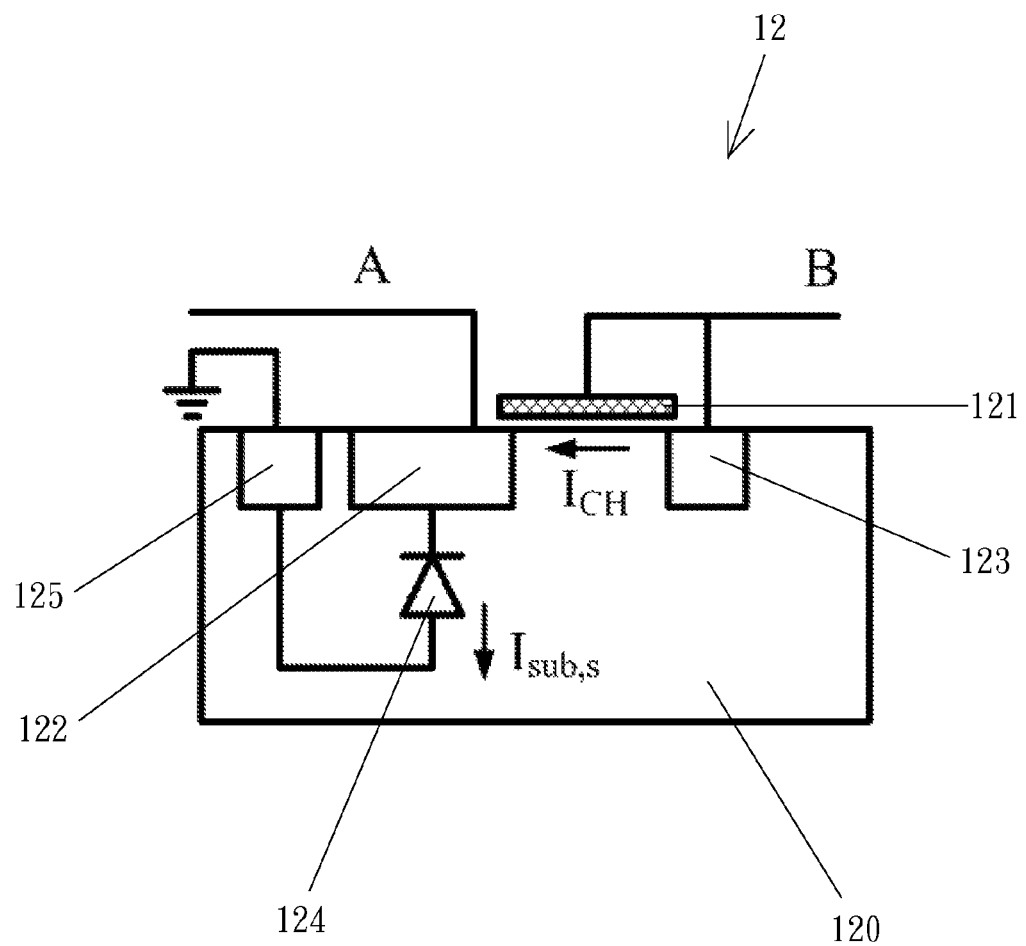
FIG. 2 is a schematic illustration of the sub-threshold transistor of this invention.
Figure 3:
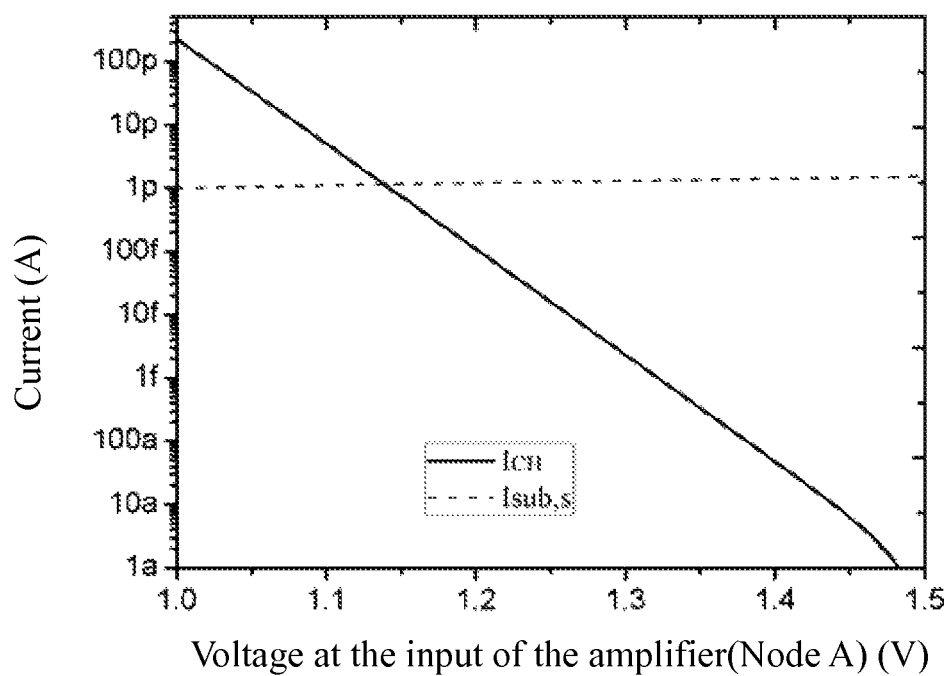
FIG. 3 is a relationship graph between the leakage current and the channel current of the sub-threshold transistor.

With reference to FIGS. 1 to 3, an integrated low-noise sensing circuit with efficient bias stabilization (1) in accordance with the present invention comprises a first capacitance sensing element (10), a second capacitance sensing element (11), a sub-threshold transistor (12) and an amplifier circuit (13) wherein the first stage is an input transistor, provides a stable input bias voltage and a stable feedback resistance, does not degrade the signal strength, makes the amplifier resistant to the die-to-die variation of the sub-threshold transistor (12) and does not need any extra power and area.

The second capacitance sensing element (11) is connected to the first capacitance sensing element (10). As shown in FIGS. 1 and 2, the sub-threshold transistor (12) comprises a body (120), a gate (121), a source (122), a drain (123), a source-body junction diode (124), a bulk (125), a drain-body junction, a source-body junction, a leakage current ($I_{sub,\,s}$), and a channel current ($I_{ch}$). The gate ( ) forms on top of the body (120). The source (122) forms on the body (120) and is connected to the first capacitance sensing element (10) and the second capacitance sensing element (11). The drain (123) forms on the body (120) and is connected to the gate (121) of the sub-threshold transistor (12). The source-body junction diode (124) comprises an anode and a cathode. The anode is connected to the ground. The cathode is connected to the first capacitance sensing element (10), the second capacitance sensing element (11) and the source (122) of the sub-threshold transistor (12).

The drain-body junction is between the body (120) and the drain (123) of the sub-threshold transistor (12). The source-body junction between the body (120) and the source (122) of the sub-threshold transistor (12) is larger than the drain-body junction and is reverse biased. It has an area that ranges between 100 to 10000 μm².

The leakage current ($I_{sub, s}$) passes through the source-body junction diode (124). The channel current ($I_{ch}$) passes from the drain (123) through the body (120) under the gate (121) and to the source (122).

The amplifier circuit (13) comprises a gate (130), a source (131) and a drain (132). It may be the first stage of an amplifier or may be the amplifier itself. The gate (130) is connected to the first capacitance sensing element (10), the second capacitance sensing element (11), the source (122) of the sub-threshold transistor (12) and the cathode of the source-body junction diode. The amplifier circuit (13) has an input (node A) and an output (node B). The input (node A) is the gate (130) of the amplifier circuit (13) and has a bias voltage. The output (node B) is connected to the drain (123) and gate of the sub-threshold transistor (12) and has a voltage. When the amplifier circuit (13) forms the amplifier, the drain (132) is connected to the drain (123) of the sub-threshold transistor (12).

With reference to FIGS. 1 to 3, in the present invention, the leakage current ($I_{sub, s}$) is of pA in the order of magnitude for all the possible range of the voltage at the input (node A). Normally, when compared with the other possible leakage currents at the same node, the leakage current ($I_{sub, s}$) of this magnitude is much larger. Yet, it is still small enough to keep the sub-threshold transistor (12) in sub-threshold region. The leakage current ($I_{sub, s}$) can be used to stabilize the bias voltage at the input (node A). If somehow the voltage at the input (node A) is raised, the channel current ($I_{ch}$) should be reduced exponentially because the reverse bias of the source-body junction is increased. On the other hand, the channel current ($I_{ch}$) is increased and the leakage current ($I_{sub, s}$) must decrease, if the voltage of the input (node A) is lowered. The trend of the change in the leakage current ($I_{sub, s}$) is opposite to that of the channel current ($I_{ch}$). Kirchhoff's current law (KCL) requires that these two currents must be equal. Therefore, the voltage of the input (node A) is stabilized at some fixed value set by the voltage of the output (node B) and the channel current ($I_{ch}$).

The present invention efficiently prevents an input bias voltage from drifting toward either VDD or the ground, as long as the leakage current ($I_{sub, s}$) remains the dominant leakage current at the input (node A). Although the leakage current ($I_{sub, s}$) has dependence on the reverse bias across the source-body junction, this dependence is very small. Since the channel current ($I_{ch}$) is required to be equal to the leakage current ($I_{sub, s}$), the resultant channel current ($I_{ch}$) flowing in the sub-threshold transistor (12) becomes relatively constant. Even if the threshold voltage of the sub-threshold transistor (12) has some variation, only the balance value of the voltage of the input (node A) is shifted by the variation. The effective resistance of the sub-threshold transistor (12) still stays quite constant. All the benefits can be achieved without using any extra circuitry and power.

While the invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

What is claimed is:

1. An integrated low-noise sensing circuit with efficient bias stabilization comprises:
   a first capacitance sensing element;
   a second capacitance sensing element being connected to the first capacitance sensing element;
   a sub-threshold transistor comprising
      a body;
      a gate forming on the body;
      a source forming on the body and being connected to the first capacitance sensing element and the second capacitance sensing element;
      a drain forming on the body and being connected to the gate of the sub-threshold transistor;
      a source-body junction diode comprising
         an anode being connected to the ground; and
         a cathode being connected to the first capacitance sensing element, the second capacitance sensing element and the source of the sub-threshold transistor; and
      a bulk; and
   an amplifier circuit comprising
      a gate being connected to the first capacitance sensing element, the second capacitance sensing element, the source of the sub-threshold transistor and the cathode of the source-body junction diode;
      a source; and
      a drain.

2. The integrated low-noise sensing circuit with efficient bias stabilization as claimed in claim 1, wherein the amplifier circuit forms an amplifier, the drain of the amplifier circuit is connected to the drain of the sub-threshold transistor.

3. The integrated low-noise sensing circuit with efficient bias stabilization as claimed in claim 1, wherein the sub-threshold transistor has a source-body junction and a drain-body junction, the source-body junction is between the body and the source of the sub-threshold transistor and larger than the drain-body junction, the drain-body junction is between the body and the drain of the sub-threshold transistor.

4. The integrated low-noise sensing circuit with efficient bias stabilization as claimed in claim 1, wherein the source-body junction has an area that ranges between 100 to 10000 μm².

5. The integrated low-noise sensing circuit with efficient bias stabilization as claimed in claim 1, wherein the input transistor is an amplifier.

* * * * *